United States Patent
Held et al.

(10) Patent No.: US 11,054,450 B2
(45) Date of Patent: Jul. 6, 2021

(54) METHOD OF CALIBRATING A MEASUREMENT AND ANALYZING DEVICE AS WELL AS METHOD OF MEASURING A FREQUENCY-CONVERTING DEVICE UNDER TEST

(71) Applicant: Rohde & Schwarz GmbH & Co. KG, Munich (DE)

(72) Inventors: Werner Held, Munich (DE); Jan-Patrick Schultheis, Munich (DE); Jakob Hammer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 193 days.

(21) Appl. No.: 16/514,875

(22) Filed: Jul. 17, 2019

(65) Prior Publication Data
US 2021/0018545 A1   Jan. 21, 2021

(51) Int. Cl.
| | |
|---|---|
| *G01R 35/00* | (2006.01) |
| *G01R 27/32* | (2006.01) |
| *H03D 7/16* | (2006.01) |
| *H04B 17/21* | (2015.01) |
| *G01R 27/28* | (2006.01) |
| *G01R 27/02* | (2006.01) |
| *G01R 27/26* | (2006.01) |

(Continued)

(52) U.S. Cl.
CPC ............ *G01R 27/32* (2013.01); *G01R 27/02* (2013.01); *G01R 27/2605* (2013.01); *G01R 27/28* (2013.01); *G01R 31/3191* (2013.01); *G01R 35/00* (2013.01); *G01R 35/005* (2013.01); *H03D 7/16* (2013.01); *H04B 17/21* (2015.01); *G01R 31/2822* (2013.01)

(58) Field of Classification Search
CPC ...... G01R 35/005; G01R 35/00; G01R 27/28; G01R 27/02; G01R 27/2605; G01R 31/3191; G01R 27/32; G01R 31/2822; H03D 7/16; H04B 17/21; H04B 17/13
USPC ..... 324/74, 76.11–76.83, 202, 600, 601, 619
See application file for complete search history.

(56) References Cited

U.S. PATENT DOCUMENTS

| | | |
|---|---|---|
| 7,561,987 B2 | 7/2009 | Nakayama et al. |
| 2008/0211515 A1* | 9/2008 | Mori ..................... G01R 27/04 324/601 |

(Continued)

*Primary Examiner* — Raul J Rios Russo
(74) *Attorney, Agent, or Firm* — Christensen O'Connor Johnson Kindness PLLC

(57) ABSTRACT

A method of calibrating a measurement and analyzing device for measuring a frequency-converting device under test, comprises the steps of connecting a first port of the measurement and analyzing device with a radio frequency port assigned to the frequency-converting device under test as well as connecting a second port of the measurement and analyzing device with an intermediate frequency port assigned to the frequency-converting device under test. Further, a scalar-mixer calibration is performed at the radio frequency port and the intermediate frequency port, thus providing a precise calibration conversion amplitude. A relative calibration is performed between the radio frequency port and the intermediate frequency port by using a calibration mixer. At least one correction coefficient is determined by the difference between the results obtained from the scalar-mixer calibration and the relative calibration. The at least one correction coefficient is used to correct an error term applied.

16 Claims, 2 Drawing Sheets

(51) Int. Cl.
*G01R 31/319* (2006.01)
*G01R 31/28* (2006.01)

(56) References Cited

U.S. PATENT DOCUMENTS

2010/0204943 A1\* 8/2010 Heuermann ......... G01R 35/005
702/85
2017/0111809 A1\* 4/2017 Entsfellner .......... G01R 35/005

\* cited by examiner

METHOD OF CALIBRATING A MEASUREMENT AND ANALYZING DEVICE AS WELL AS METHOD OF MEASURING A FREQUENCY-CONVERTING DEVICE UNDER TEST

FIELD OF THE DISCLOSURE

Embodiments of the present disclosure relate to a method of calibrating a measurement and analyzing device for measuring a frequency-converting device under test. Further, embodiments of the present disclosure relate to a method of measuring a frequency-converting device under test by a measurement and analyzing device.

BACKGROUND

Measurement and analyzing devices such as (vector) network analyzer are used to measure the characteristics and/or properties of a device under test, for instance, a frequency-converting device under test. For ensuring an accurate measurement of the device under test, the respective measurement and analyzing device, namely the vector network analyzer (VNA), has to be calibrated previously such that a maximum of precision is ensured when measuring the device under test.

Typically, a certain calibration technique is used dependent on the test scenario to be applied on the device under test. For instance, a calibration technique is used that provides accurate phase calibration provided that the test scenario to be applied requires a precise phase measurement, whereas a calibration technique is used that provides accurate amplitude calibration provided that the test scenario to be applied requires a precise amplitude measurement. Accordingly, different calibration techniques are known wherein the respective calibration technique is chosen with respect to the test scenario applied on the device under test.

However, the calibration techniques known so far do not simultaneously provide an accurate amplitude and phase calibration in a cost-efficient manner.

SUMMARY

Accordingly, there is a need for a precise and cost-efficient manner to calibrate a measurement and analyzing device with respect to amplitude and phase.

Embodiments of the present disclosure provide a method of calibrating a measurement and analyzing device for measuring a frequency-converting device under test. In an embodiment, the method comprises the following steps:

connecting a first port of the measurement and analyzing device with a radio frequency port assigned to the frequency-converting device under test;

connecting a second port of the measurement and analyzing device with an intermediate frequency port assigned to the frequency-converting device under test;

performing a scalar-mixer calibration at the radio frequency port and the intermediate frequency port, thus providing a precise calibration conversion amplitude;

performing a relative calibration between the radio frequency port and the intermediate frequency port by using a calibration mixer;

determining at least one correction coefficient by means of the difference between the results obtained from the scalar-mixer calibration and the relative calibration; and using the at least one correction coefficient to correct an error term applied.

Accordingly, a single calibration technique is provided, which combines a scalar-mixer calibration technique with a relative calibration technique in order to simultaneously obtain accurate amplitude and phase calibration of the measurement and analyzing device. The results obtained from the scalar-mixer calibration technique as well as the relative calibration technique both are used to determine at least one correction coefficient that is used to adapt or rather correct an error term used by an error model applied for calibration purposes. Put differently, the error term model applied is adapted while taking the results of the scalar-mixer calibration as well as the relative calibration into account.

The radio frequency port (RF port) as well as the intermediate frequency port (IF port) relate to calibration planes, which are assigned to the device under test. In other words, the RF port and the IF port are the positions of calibration. Typically, the device under test is not directly connected to the measurement and analyzing device, but via cables and/or fixtures.

In general, scalar-mixer calibration provides an accurate calibration with respect to amplitude. However, the scalar-mixer calibration technique does not allow for an accurate phase measurement. Therefore, a relative calibration technique is also applied wherein a calibration mixer is used in order to obtain information with respect to phase. In some embodiments, relative calibration assumes that the calibration mixer used is reciprocal in amplitude and phase. Thus, any non-reciprocity results in an error/offset in the measured amplitude and phase, providing at least one error term. This error term may be adapted by the correction coefficient determined.

The combination of both techniques, namely the scalar-mixer calibration technique as well as the relative calibration technique, ensures precise measurements of the frequency-converting device under test with respect to amplitude and phase, as the respective results obtained by the calibrations are compared with each other in order to determine correction coefficients for the at least one error term applied.

In other words, the phase calibration is mainly done by the relative calibration technique, namely via the calibration mixer, wherein the amplitude calibration is mainly done by the scalar-mixer calibration technique. However, the results of both calibration techniques are combined with each other in order to determine the correction coefficient that ensures an accurate calibration with regard to amplitude and phase simultaneously. Hence, precise measurements of the frequency-converting device under test can be done by the calibrated measurement and analyzing device with respect to amplitude and phase in a cost-efficient manner as compared to a comb generator setup.

Generally, the measurement and analyzing device relates to a network analyzer or rather a vector network analyzer or VNA for short.

According to an aspect, the at least one correction coefficient is determined by a phase difference between the results obtained from the scalar-mixer calibration and the relative calibration. As mentioned above, the relative calibration provides accurate information with respect to the phase, whereas the scalar-mixer calibration does not allow a precise phase measurement of the device under test due to the inaccurate phase calibration. Thus, a phase difference occurs between the results obtained from both calibration techniques, which may be used to determine the correction coefficient. Put differently, the phase information obtained by means of the scalar-mixer calibration technique is corrected due to the information obtained from the relative calibration.

For instance, the correction coefficient relates to a phase correction factor, which is a complex number having a normalized amplitude, namely an amplitude that equals 1.

The correction coefficient may be a complex correction coefficient.

According to another aspect the at least one correction coefficient is determined by an amplitude difference between the results obtained from the scalar-mixer calibration and the relative calibration. Therefore, the error term relating to the amplitude may also be adapted appropriately. As mentioned above, the scalar-mixer calibration provides accurate information with respect to the amplitude, whereas the relative calibration does not allow a precise amplitude measurement of the device under test due to the inaccurate amplitude calibration. Thus, an amplitude difference occurs between the results obtained from both calibration techniques, which may be used to determine the correction coefficient. Put differently, the amplitude information obtained by the relative calibration technique is corrected due to the information obtained from the scalar-mixer calibration.

For instance, the scalar-mixer calibration can be carried out by a PUOSM calibration technique. The PUOSM calibration technique is based on a UOSM calibration technique and an additional power calibration. The UOSM calibration technique is known in the state of the art, as different calibration standards, namely Open, Short, Match, are used at each port of the measurement and analyzing device for calibration purposes. Hence, different measurements at the respective ports are done during UOSM calibration. In addition to UOSM calibration, a power calibration can be done.

Typically, different error terms are derived by the UOSM calibration technique for each signal direction, namely reflection tracking, source match, directivity, and load match.

In some embodiments, a power meter is used for the additional power calibration, for example, a scalar power meter. The power meter ensures that the ports can be power calibrated. In some embodiments, the power meter measures the exact source power at the respective calibration point, namely the radio frequency port and the intermediate frequency port, respectively. For instance, the external power meter is connected to the respective calibration plane or rather calibration point. The measurement and analyzing device, for instance the vector network analyzer, uses the power meter readings to calibrate its reference receiver. Subsequently, the measurement and analyzing device modifies its source power so that the calibrated reference receiver reading corresponds to the desired source power value (flatness calibration).

According to another aspect, a calibration unit or a calibration kit having several calibration terminations is used for the scalar-mixer calibration. In some embodiments, the several calibration terminations relate to the calibration standards used by UOSM calibration techniques, namely an open termination, a short termination as well as a match termination, also called load termination. The respective terminations are connected with the respective calibration port, namely the radio frequency port or rather the intermediate frequency port.

Alternatively, a calibration unit may be used for the scalar-mixer calibration. The calibration unit is interconnected between the radio frequency port and the intermediate frequency port, which can be controlled by the measurement and analyzing device in order to automatically measure the UOSM calibration without any further manual interaction. In some embodiments, the calibration unit can include software or hardware or in a combination of hardware and software to carry out some or all of its functions set forth herein.

The radio frequency port may be provided at an end of a respective cable which opposite end is connected with the first port of the measurement and analyzing device. Put differently, the calibration plane or rather the calibration point, namely the radio frequency port, is located at the interface of the respective cable that is used for interconnecting the device under test with the measurement and analyzing device. Thus, the radio frequency port is assigned to an input or rather output port of the frequency-converting device under test.

Furthermore, the intermediate frequency port may be provided at an end of a respective cable which opposite end is connected with a second port of the measurement and analyzing device. In a similar manner, the calibration plane or rather the calibration point, namely the intermediate frequency port, is provided by the interface of a respective cable which is used to connect the device under test with the measurement and analyzing device. Thus, the intermediate frequency port is also assigned to an input or rather output port of the frequency-converting device under test.

According to another aspect, the measurement and analyzing device has a third port assigned to an integrated local oscillator. The third port is connected with a local oscillator port assigned to the frequency-converting device under test. The measurement and analyzing device may comprise an integrated local oscillator to which the local oscillator port is assigned. For instance, a cable is connected with the third port of the measurement and analyzing device. Typically, the measurement and analyzing device, namely the vector network analyzer, comprises a phase reproducible source, which is necessary for conducting the measurements of the frequency-converting device under test. Put differently, the frequency-converting device under test receives the local oscillator signal from the measurement and analyzing device via the third port, for example, the local oscillator port.

Alternatively, a reference mixer may be interconnected between the intermediate frequency port (or the radio frequency port) and the second port (or the first port) of the measurement and analyzing device. The reference mixer and the device under test both have a common local oscillator frequency. Put differently, the mixer is placed in the calibration setup at a location being assigned behind the device under test during its measurement. In order to ensure a proper calibration of the measurement and analyzing device, the reference mixer is located at the respective position at which the reference mixer is located during the respective measurement(s) later.

The reference mixer converts the signal(s) used for measurement in the same way as the frequency-converting device under test does. The reference mixer as well as the frequency-converting device under test have a common local oscillator frequency. Accordingly, the reference mixer and the device under test may undo each other with respect to the signal conversion, for example, the frequency conversion.

Further, embodiments of the present disclosure provide a method of measuring a frequency-converting device under test by means of a measurement and analyzing device that is calibrated by a method as described above. Hence, the measurement of the frequency-converting device under test is accurately calibrated with regard to amplitude and phase, as the measurement and analyzing device has been calibrated previously in the manner described above. Put differently, the amplitude and phase of the frequency-converting device under test can be measured simultaneously in a precise manner, as the measurement and analyzing device has been calibrated with regard to phase and amplitude previously.

Accordingly, it is not necessary to calibrate the measurement and analyzing device with respect to phase and to perform a phase measurement and, afterwards, to calibrate the measurement and analyzing device with respect to amplitude in order to perform the amplitude measurement, as the measurement and analyzing device can be calibrated with respect to phase and amplitude simultaneously. Thus, the respective measurements can be done simultaneously or rather without any interposing calibration. Accordingly, the time required for measuring a respective frequency-converting device under test can be reduced significantly.

According to an aspect, a third port of the measurement and analyzing device is connected with a local oscillator input of the frequency-converting device under test. The third port is assigned to a local oscillator that is integrated in the measurement and analyzing device. Thus, a local oscillator signal is forwarded from the measurement and analyzing device towards the frequency-converting device under test in order to convert the signal(s) processed by the frequency-converting device under test during the respective measurement, for example, the frequency.

Alternatively, a reference mixer may be interconnected between an intermediate frequency port (or radio frequency port) and a second port (or first port) of the measurement and analyzing device. The reference mixer and the device under test both have a common local oscillator frequency. The reference mixer may be connected behind the frequency-converting device under test. As the reference mixer as well as the device under test have a common local oscillator frequency, the signals processed by the frequency-converting device under test and the reference mixer are converted in a similar manner so that the reference mixer and the device under test undo each other.

The scalar-mixer calibration generally allows for measuring the magnitude value and reflection parameter of the conversion loss with very high accuracy by performing calibration using calibration standards, namely standards relating to Open, Short, and Load, in combination as well as a power meter. For the measurement of a conversion loss in the frequency-converting device under test, a typical 2-port calibration is not available because of the frequency difference between the stimulus port, also called source port, and the response port, also called load port.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
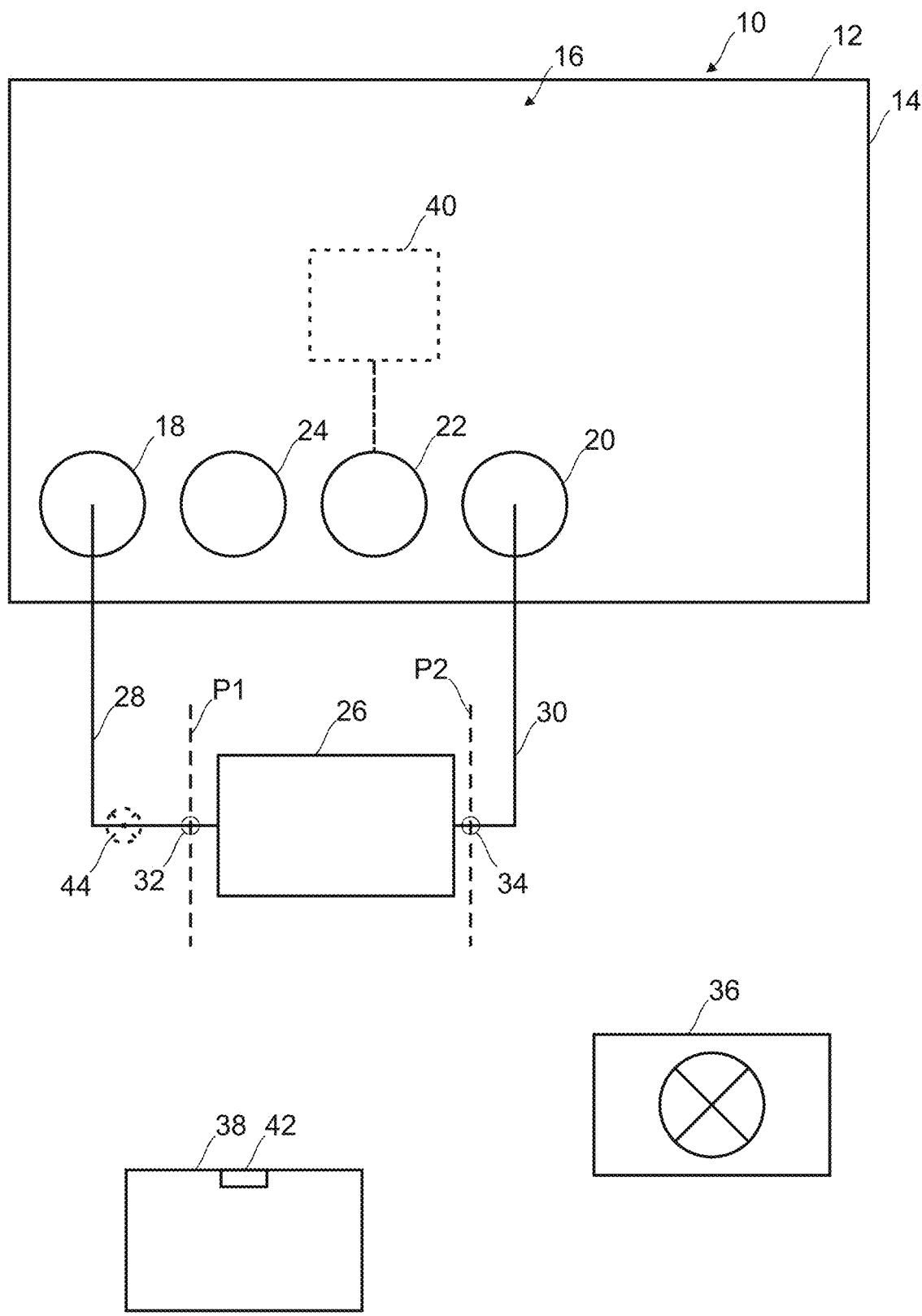
FIG. 1 schematically shows an overview of a calibration setup that is used to perform a representative method of calibrating a measurement and analyzing device according to the present disclosure.
Figure 3:
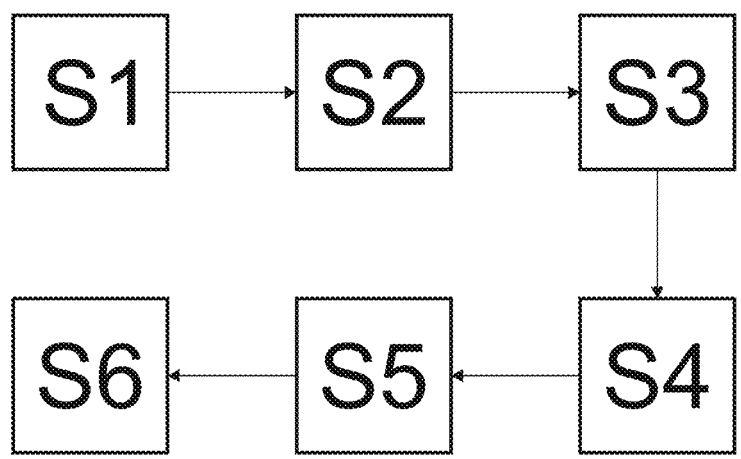
FIG. 3 shows an overview of a representative method of calibrating a measurement and analyzing device according to the present disclosure.

In FIG. 1, a calibration setup 10 is shown in which a measurement and analyzing device 12 is provided, which has to be calibrated by a method, for example, as illustrated in FIG. 3. In some embodiments, the measurement and analyzing device 12 is a vector network analyzer (VNA). In that regard, the measurement and analyzing device 12 comprises a housing 14 that encompasses measurement and analyzing components 16 as well as a first port 18, a second port 20, a third port 22 and a fourth port 24. The respective ports 18-24 are located at a frond-end of the measurement and analyzing device 12.

In the shown embodiment, the calibration setup 10 comprises a calibration unit 26 that is separately formed. As shown, the calibration unit 26 is connected with the first port 18 and the second port 20 via a first cable 28 and a second cable 30. The cables 28, 30 each define a certain calibration plane P1, P2 that are assigned to a radio frequency port 32 as well as an intermediate frequency port 34 as shown in FIG. 1.

Put differently, the radio frequency port 32 as well as the intermediate frequency port 34 relate to the positions of calibration such that influences of the cables 28, 30 are also taken into account for the calibration, as the same cables 28, 30 are used for measuring a device under test later.

Alternatively, the calibration setup 10 may comprise a calibration kit instead of the calibration unit 26. The calibration kit may have several calibration terminations that can be used for performing a calibration of the measurement and analyzing device 12, namely the radio frequency port 32 and the intermediate frequency port 34.

In addition, the calibration setup 10 comprises a calibration mixer 36 that can be (indirectly) connected with the first port 18 and the second port 20 of the measurement and analyzing device 12 instead of the calibration unit 26, namely via the cables 28, 30. In some embodiments, the calibration mixer 36 is also directly connected to the radio frequency port 32 and the intermediate frequency port 34 instead of the calibration unit 26.

In general, the method of calibrating the measurement and analyzing device 12 illustrated in FIG. 3 comprises two different calibration techniques. The respective results obtained from the different calibration techniques are used to determine at least one correction coefficient used to correct an error term of an error model applied on the measurement and analyzing device 12 for calibration purposes. However, this procedure will be described hereinafter in more detail.

In a first step S1, the first port 18 of the measurement and analyzing device 12 is connected with the radio frequency port 32 that is assigned to the frequency-converting device under test when performing a respective measurement on the frequency-converting device under test. Put differently, the first cable 28 is connected with the first port 18 of the measurement and analyzing device 12, as the first cable 28 provides the respective interface for the frequency-converting device under test.

In a second step S2, the second port 20 of the measurement and analyzing device 12 is connected with the intermediate frequency port 34 that is also assigned to the frequency-converting device under test. In a similar manner, the second cable 30 is connected with the second port 20 of the measurement and analyzing device 12, wherein the second cable 30 provides the intermediate frequency port 34, namely the respective position of calibration.

In some embodiments, the respective calibration planes P1, P2 or rather the points of calibration are set when connecting the cables 28, 30 with the measurement and analyzing device 12, which provide the interfaces for the frequency-converting device under test during the respective measurement(s) later.

In a third step S3, a scalar-mixer calibration is performed at the radio frequency port 32 as well as the intermediate frequency port 34. The scalar-mixer calibration provides a precise calibration conversion amplitude, namely an accurate calibration with respect to amplitude.

The scalar-mixer calibration may be done by a PUOSM calibration technique that is based on a UOSM calibration technique and an additional power calibration. For this purpose, the calibration unit 26 is interconnected between the radio frequency port 32 and the intermediate frequency port 34. The calibration unit 26 provides different calibration standards so that different measurements relating to the UOSM calibration technique can be conducted in an automatic manner. In some embodiments, the calibration unit can include software or hardware or in a combination of hardware and software to carry out some or all of its functions.

Further, the calibration unit 26 may comprise an integrated power meter so that the power of the respective source can be measured, namely the power provided by the measurement and analyzing device 12 at the respective position of calibration, namely the respective calibration planes P1, P2.

Alternatively, a separate power meter is connected with the radio frequency port 32 and the intermediate frequency port 34, respectively.

Of course, the calibration kit mentioned above may be used instead of the calibration unit 26. However, the calibration kit requires more manual interaction, as the several calibration terminations have to be connected with the respective ports 32, 34 in a subsequent manner while performing the respective measurements.

The scalar-mixer calibration, namely the PUOSM calibration, does a UOSM calibration at the radio frequency port 32 and the intermediate frequency port 34. In addition, a power calibration is done by the power meter, for instance the one integrated in the calibration unit 26. The scalar-mixer calibration provides an accurate calibration for the amplitude.

Usually, the information obtained by the respective calibration is written by matrices $Q_{RF}$, $Q_{IF}$ $L_{IF}$ and $L_{IF}$ as well as a complex factor $p_{rel}$. The matrices Q and L relate to a source matrix ("Q") and a load matrix ("L"). Thus, the respective ports 32, 34, namely the radio frequency port 32 as well as the intermediate frequency port 34, both can be described by matrices describing their respective behavior.

From the respective terms mentioned above, it becomes clear that the measurements are done for both signal directions. Hence, the RF port 32 may relate to the source port or rather the load port depending on the signal direction. This also applies for the IF port 34.

Figure 2:
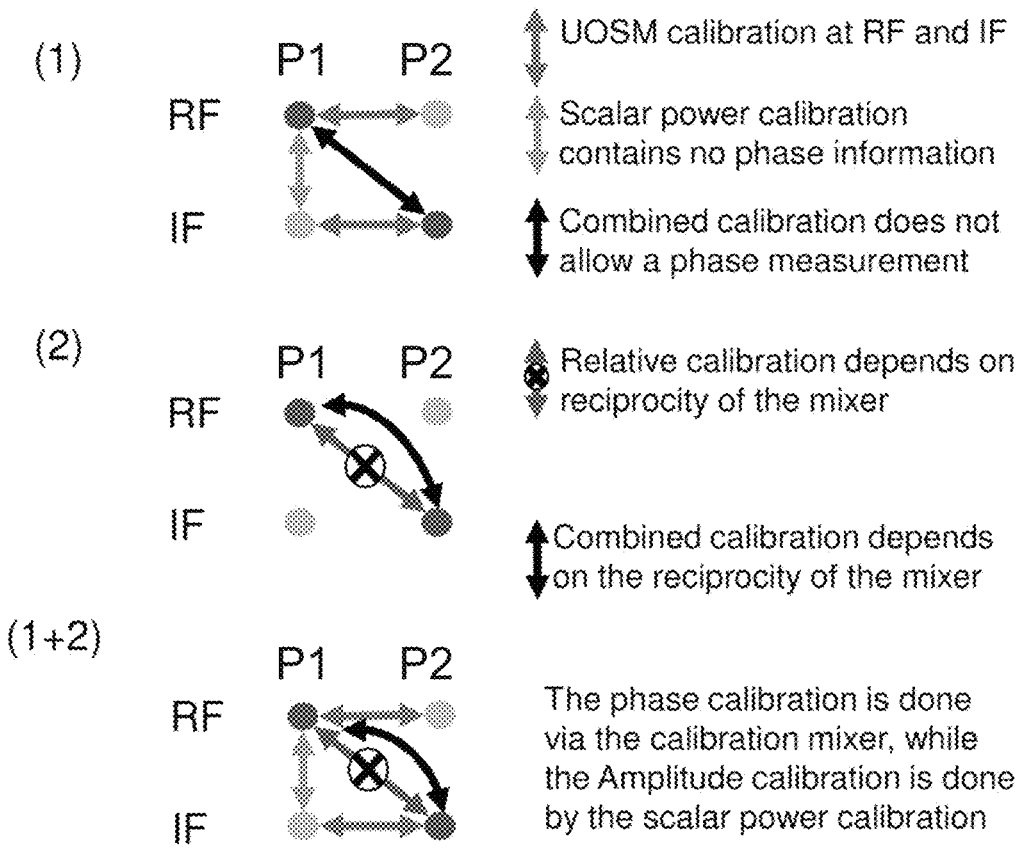
FIG. 2 schematically shows an overview illustrating the calibration techniques applied when performing a representative method of calibrating a measurement and analyzing device according to the present disclosure.

An example of the information obtained by the PUOSM calibration is shown in the overview of FIG. 2.

In a fourth step S4, a relative calibration is performed between the radio frequency port 32 and the intermediate frequency port 34 by using the calibration mixer 36. Accordingly, the calibration unit 26 is disconnected from the respective ports 32, 34 such that the calibration mixer 36 can be interconnected for performing the relative calibration. The relative calibration performed by the calibration mixer 36 provides information with regard to phase.

The relative calibration using the calibration mixer also creates the same matrices $Q_{RF}$, $Q_{IF}$, $L_{RF}$, $L_{IF}$ as well as the complex factor $p_{rel}$. For better comparing the matrices assigned to both calibration techniques, the matrices and complex factor assigned to the scalar-mixer calibration are written as $Q_{RF}(1)$, $Q_{IF}(1)$, $L_{RF}(1)$, $L_{IF}(1)$ as well as the complex factor $p_{rel}(1)$, whereas the matrices and complex factor assigned to the relative calibration are written as $Q_{RF}(2)$, $Q_{IF}(2)$, $L_{RF}(2)$, $L_{IF}(2)$ as well as the complex factor $p_{rel}(2)$.

The relative calibration assumes that the calibration mixer 36 used is reciprocal in amplitude and phase. Any non-reciprocity results in an error/offset in the measured amplitude and phase.

An example of the information obtained by the relative calibration is also shown in the overview of FIG. 2.

In a fifth step S5, at least one correction coefficient is determined by the difference between the results obtained from the scalar-mixer calibration and the relative calibration. As mentioned above, the scalar-mixer calibration ensures a precise calibration with respect to amplitude, whereas a relative calibration ensures a precise measurement with respect to phase.

Accordingly, differences with regard to amplitude or rather phase occur between the results of both calibration techniques.

Nevertheless, the combination of the results obtained by both techniques allows for use of one calibration that provides precise measurements of amplitude and phase simultaneously. Accordingly, the measurement and analyzing device 12 calibrated in an appropriate manner can be used for measuring the frequency-converting device under test with respect to amplitude and phase without any intermediate calibration of the measurement and analyzing device 12, as it is calibrated accurately with respect to amplitude and phase.

In some embodiments, the at least one correction coefficient may be determined by a phase difference between the results obtained from the scalar-mixer calibration and the relative calibration or rather by an amplitude difference between the respective results.

For instance, the correction coefficient relates to a phase correction factor k, which is added to $L_{RF}(1)$ or rather $L_{IF}(1)$, as the phase information obtained from the scalar-mixer calibration labelled by (1) is not accurate compared to the one obtained from the relative calibration.

The respective correction coefficient is a complex number having a normalized amplitude, namely an amplitude that equals 1. Thus, the correction coefficient only relates to a phase correction.

The respective phase correction coefficient can be represented by $k=\exp(i\varphi)$, wherein "I" is the imaginary number and $\varphi$ relates to the phase shift to be applied for phase correction.

The respective phase shift φ can be determined for $L_{IF}(1)$ by the following equation:

$$\varphi = (\varphi_{L_{IF22}(2)} - \varphi_{L_{IF22}(1)}) + (\varphi_{Q_{RF11}(1)} - \varphi_{Q_{RF11}(2)}) + (\varphi_{P_{rel}(1)} - \varphi_{P_{rel}(2)})$$

The respective numbers relate to the elements of the Q- or rather L-matrix. Thus, $\varphi_{L_{IF22}(2)}$ relates to the phase of the element in the second column and second row of the respective L-matrix assigned to the IF port 34.

The other correction coefficients, for instance the one for $L_{RF}(1)$, can be determined in a similar manner.

In some embodiments, the correction coefficients for the respective amplitudes, namely $L_{RF}(2)$ or rather $L_{IF}(2)$, can also be calculated in a similar manner.

Accordingly, the results obtained by the different calibration techniques described above are combined and used to determine the at least one correction coefficient. Determination of the at least one correction coefficient can be carried out in software or hardware or in a combination of hardware and software.

An example of the information obtained by the combined calibration techniques is shown in the overview of FIG. 2 as well.

Afterwards, the at least one correction coefficient determined is used to correct at least one error term of an error term model applied in order to calibrate the measurement and analyzing device 12 in a sixth step S6.

Once the measurement and analyzing device 12 has been calibrated as described above, a frequency-converting device under test 38 may be measured with respect to phase and amplitude simultaneously in a precise manner.

Therefore, the frequency-converting device under test 38 is interconnected between the first port 18 and the second port 20 via the first cable 28 and the second cable 30. Put differently, the frequency-converting device under test 38 replaces the calibration unit 26 or rather the calibration mixer 36, as the frequency-converting device under test 38 is connected with the radio frequency port 32 and the intermediate frequency port 34.

In addition, the frequency-converting device under test 38 may be connected with the third port 22 of the measurement and analyzing device 12 that is assigned to an integrated local oscillator 40.

The frequency-converting device under test 38 may provide a local oscillator input 42 that is connected with a cable 44, which in turn is connected with the third port 22 of the measurement and analyzing device 12.

The local oscillator signal provided by the local oscillator 40 of the measurement and analyzing device 12 provides a phase reproducible signal that is forwarded to the frequency-converting device under test 38 for converting the respective input signal appropriately.

In an alternative manner, a reference mixer 46 may be interconnected between the frequency-converting device under test 38 and the first port 18 or rather the second port 20, depending on the respective measurement operation.

The reference mixer 46 and the frequency-converting device under test 38 both have a common local oscillator frequency so that the signal, for example its frequency, is converted by the frequency-converting device under test 38 and the reference mixer 46 in a similar manner. Thus, the frequency-converting device under test 38 and the reference mixer 46 both undo each other with respect to the signal conversion.

In case of using the reference mixer 46 for measuring the frequency-converting device under test 38, the reference mixer 46 is also placed at the intended position during the calibration method. Thus, it is ensured that the overall system is calibrated in an appropriate manner.

In general, a single calibration method is provided that ensures to calibrate the measurement and analyzing device 12 with respect to amplitude and phase in an accurate manner. The measurement and analyzing device 12 can be used to precisely measure the frequency-converting device under test 38 with respect to amplitude and phase.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method of calibrating a measurement and analyzing device for measuring a frequency-converting device under test, comprising:
   connecting a first port of the measurement and analyzing device with a radio frequency port assigned to the frequency-converting device under test;
   connecting a second port of the measurement and analyzing device with an intermediate frequency port assigned to the frequency-converting device under test;
   performing a scalar-mixer calibration at the radio frequency port and the intermediate frequency port, thus providing a precise calibration conversion amplitude;
   performing a relative calibration between the radio frequency port and the intermediate frequency port by using a calibration mixer;
   determining at least one correction coefficient by the difference between the results obtained from the scalar-mixer calibration and the relative calibration; and
   using the at least one correction coefficient to correct an error term applied.

2. The method according to claim 1, wherein the at least one correction coefficient is determined by a phase difference between the results obtained from the scalar-mixer calibration and the relative calibration.

3. The method according to claim 1, wherein the at least one correction coefficient is determined by an amplitude difference between the results obtained from the scalar-mixer calibration and the relative calibration.

4. The method according to claim 1, wherein the scalar-mixer calibration is done by a PUOSM calibration technique, the PUOSM calibration technique being based on a UOSM calibration technique and an additional power calibration.

5. The method according to claim 4, wherein a power meter is used for the additional power calibration.

6. The method according to claim 1, wherein a calibration unit is used for the scalar-mixer calibration.

7. The method according to claim 1, wherein a calibration kit having several calibration terminations is used for the scalar-mixer calibration.

8. The method according to claim 1, wherein the radio frequency port is provided at an end of a respective cable which opposite end is connected with the first port of the measurement and analyzing device.

9. The method according to claim 1, wherein the intermediate frequency port is provided at an end of a respective cable which opposite end is connected with the second port of the measurement and analyzing device.

10. The method according to claim 1, wherein the measurement and analyzing device has a third port assigned to an integrated local oscillator, the third port being connected with a local oscillator port assigned to the frequency-converting device under test.

11. The method according to claim 1, wherein a reference mixer is interconnected between the intermediate frequency port and the second port of the measurement and analyzing device, the reference mixer and the device under test both having a common local oscillator frequency.

12. The method according to claim 1, wherein a reference mixer is interconnected between the radio frequency port and the first port of the measurement and analyzing device, the reference mixer and the device under test both having a common local oscillator frequency.

13. A method of measuring a frequency-converting device under test by a measurement and analyzing device, the measurement and analyzing device being calibrated by a method according to claim 1.

14. The method according to claim 13, wherein a third port of the measurement and analyzing device is connected with a local oscillator input of the frequency-converting device under test, the third port being assigned to a local oscillator that is integrated in the measurement and analyzing device.

15. The method according to claim 13, wherein a reference mixer is interconnected between an intermediate frequency port and a second port of the measurement and analyzing device, the reference mixer and the device under test both having a common local oscillator frequency.

16. The method according to claim 13, wherein a reference mixer is interconnected between a radio frequency port and a first port of the measurement and analyzing device, the reference mixer and the device under test both having a common local oscillator frequency.

* * * * *